United States Patent [19]
Kato

[11] Patent Number: 5,594,689
[45] Date of Patent: Jan. 14, 1997

[54] NON-VOLATILE SEMICONDUCTOR MEMORY CAPABLE OF ERASE-VERIFYING MEMORY CELLS IN A TEST MODE USING A DEFECTIVE COUNT CIRCUIT ACTIVATED BY A TEST MODE SIGNAL

[75] Inventor: Yasushi Kato, Tokyo, Japan

[73] Assignee: NEC Corporation, Tokyo, Japan

[21] Appl. No.: 613,692

[22] Filed: Mar. 11, 1996

[30] Foreign Application Priority Data

Mar. 10, 1995 [JP] Japan ................................ 7-079611

[51] Int. Cl.$^6$ ................................................ G11C 16/04
[52] U.S. Cl. .............................. 365/185.22; 365/185.3; 365/185.33; 365/185.2; 365/236; 365/201; 365/225.7; 365/185.09
[58] Field of Search ........................ 365/185.22, 185.3, 365/185.33, 185.2, 236, 201, 225.7, 185.09

[56] References Cited

U.S. PATENT DOCUMENTS 5,327,384 7/1994 Ninomiya ........................ 365/185.22
5,532,959 7/1996 Ninomiya et al. ................ 365/185.3

FOREIGN PATENT DOCUMENTS 182479 7/1993 Japan.

Primary Examiner—David C. Nelms
Assistant Examiner—Andrew Q. Tran
Attorney, Agent, or Firm—Sughrue, Mion, Zinn, Macpeak & Seas

[57] ABSTRACT

A flash memory having a defective count circuit. In an erasing operation, when an erase and an erase verify are repeatedly performed, the defective count circuit counts the number of unerased memory cells having a slow erase speed, in the course of the erase verify. If the counted number of the unerased memory cells becomes higher than a predetermined number, the erase verify is stopped, and the erase is performed again. On the other hand, if the counted number of the unerased memory cells is not higher than a predetermined number, the erasing operation is completed. Therefore, most of memory cells excluding a small number of memory cells having slow erase speed are properly erased with no over-erasing.

8 Claims, 6 Drawing Sheets

NON-VOLATILE SEMICONDUCTOR MEMORY CAPABLE OF ERASE-VERIFYING MEMORY CELLS IN A TEST MODE USING A DEFECTIVE COUNT CIRCUIT ACTIVATED BY A TEST MODE SIGNAL

BACKGROUND OF THE INVENTION

1. Field of the Invention

The present invention relates to a non-volatile semiconductor memory, and more specifically to a circuit for recognizing an accurate defective condition of a flash memory having an automatic erase function.

2. Description of Related Art

The most typical non-volatile semiconductor memory which is electrically programmable and can be simultaneously erased by one operation (called a "flash memory" hereinafter), includes memory cells each having a floating gate completely covered with an insulator layer. Data is written into this flash memory by injecting charges to the floating gate by means of a hot electron avalanche breakdown or channeling, so that a threshold of a memory cell transistor is raised. On the other hand, an erasing is executed by removing the electric charges from the floating gate by action of a tunneling of the electric charges between the floating gate and a source or a substrate of the memory cell.

In the above mentioned flash memory, because of its memory cell structure suitable to the flash erasing and its erasing manner, some number of memory cells are often disadvantageously over-erased so that a threshold of the memory cells becomes negative, namely, the memory cells are ceaselessly conductive. As a result, all of memory cells connected to a bit line connected to the ceaselessly conductive memory cell seem conductive.

In order to overcome this problem, it has been a conventional practice to write all the memory cells before the flash erasing operation of the memory cells, so that electrons are injected into the floating gate of each memory cell, so as to equalize the charged situation in the floating gate of all the memory cells (pre-erase writing). Thereafter, an erasing operation is actually performed for a time period which is considerably shorter than a time length required to finally completely erase all the memory cells, and then, an erase inspection voltage generated by dropping an external power supply voltage in the inside of the memory device, is applied to a gate of each memory cell, for the purpose of inspecting whether or not all the memory cells are in an erased condition, namely, in a conductive condition. This inspection is called an "erase verify" hereinafter.

The operation consisting of the erase and the erase verify is succeedingly repeated many times until data has been completely erased from all the memory cells. Thus, in the prior art, it has been attempted to equalize the erased situation of each memory cell (namely, to minimize a variation of the erased condition, thereby to equalize the threshold of each erased memory cell).

Furthermore, with increase of a memory capacity, possibility that a memory array mixedly includes memory cells having erasing speeds greatly different from one another, elevates. Therefore, it has been also attempted to divide the memory, cell array into a plurality of memory cell blocks and to perform the above mentioned memory erasing operation for each one memory cell block, so that the whole of the memory cell array is equally erased (See Japanese Patent Application Laid-open Publication No. JP-A-05-182479, which corresponds to U.S. Pat. No. 5,327,384, the disclosure of which is incorporated by reference in its entirety into this application).

Referring to FIG. 1, there is shown a block diagram illustrating one example of a conventional flash memory, which is conceptionally similar to the disclosure of JP-A-05-182479 and U.S. Pat. No. 5,327,384. As shown in FIG. 1, the conventional flash memory includes a data input/output circuit 1 coupled to a data input/output terminal I/O, a write circuit 2, a read circuit 3, a column selector 4, a column decoder 5, a row decoder 6, a memory cell array 7 divided into a plurality of blocks, an erase circuit 8 including block erase circuits No. 1 and No. 2 provided for controlling the erase for each one memory cell block, an erase discrimination circuit 9, a control circuit 11, an internal address generator 12, and an address input circuit 13 coupled to a group of address signal input terminals A0 to Ai, which are coupled as shown.

In addition, Reference Numerals S21 and S31 designate various internal signals. If data to be written is supplied through the data input/output terminal I/O to the data input/output circuit 1, an internal data signal S21 is supplied from the data input/output circuit 1 to the write circuit 2, from which an internal data signal S22 is supplied to the column selector 4, so that the data signal is written into the memory cell array 7. On the other hand, an internal data signal S23 read out from the memory cell array 7 is supplied through the column selector 4 to the read circuit 3, from which an amplified internal read-out data signal S24 is supplied to the data input/output circuit 1, so that the read-out data is outputted from the data input/output circuit 1 to the data input/output terminal I/O.

The amplified internal read-out data signal S24 is also supplied to the erase discrimination circuit 9, which generates an erase discrimination signal S25 to the control circuit 11, which in turn generates a control signal S26 to the internal address generator 12 and the address input circuit 13. The control circuit 11 also generates an erase control signal S27, which are supplied to the column decoder 5, the row decoder 6 and the erase circuit 8. The block erase circuits No. 1 and No. 2 of the erase circuit 8 supply erase voltage signals S29 and S28 to the corresponding memory cell blocks of the memory cell array 7, respectively. An address S30 is supplied through the address input terminals A0 to Ai to the address input circuit 13, which generates an internal address S32. This internal address S32 and another internal address S31 generated by the internal address generator 12, are supplied to the column decoder 5, the row decoder 6 and the erase circuit 8.

As mentioned above, in the conventional flash memory, the larger the number of memory cells becomes, the large the degree of variation in the erasing speed between a memory cell having the highest erasing speed and a memory cell having the lowest erasing speed becomes. As a result, when it is confirmed by the erase verify that the memory cell having the lowest erasing speed has been erased, the memory cell having the highest erasing speed becomes a ceaselessly conductive condition, namely, an over-erased condition. Namely, an erase defective occurs, and therefore, a stable erasing operation becomes difficult.

In addition, if the memory array is divided into a plurality of blocks and an erasing operation is controlled for each one block, probability of the erase defective drops, however, the possibility of the erase defective never becomes zero, because this is not an essentially solving means.

Furthermore, in the conventional erasing manner for the flash memory, since the erasing operation is repeated until the memory cell having the lowest erasing speed has been erased, if a memory cell which cannot be erased completely is included in the memory cell array, the memory device is put into the over-erased condition, namely, becomes defective. This means that an accurate repairing decision cannot be made in a wafer checking step based on the precondition that the memory device is repaired by use of a redundancy. Namely, a memory device having only a few bits of memory cells which cannot be erased, namely, a memory device which can be repaired by use of the redundancy, is put into the over-erased condition of the whole of the memory cell array, which can no longer repaired by use of the redundancy. As a result, the yield of production drops.

In a procedure for accurately repairing the memory device including memory cells which cannot be completely erased, by use of the conventional circuit, the "erasing" and the "erase verify" are repeated on the basis of an algorithm of the checking system, not by an automatic control basis. However, this procedure requires a voluminous time for the data processing in the checking, system, and a long offset time for the device measurement. Accordingly, the wafer checking processing drops a mass production efficiency.

SUMMARY OF THE INVENTION

Accordingly, it is an object of the present invention to provide a non-volatile semiconductor memory which has overcome the above mentioned defect of the conventional one.

Another object of the present invention is to provide a flash memory having an erase control circuit capable of avoiding an over-erased condition, namely, occurrence of an erase defective.

The above and other objects of the present invention are achieved in accordance with the present invention by a non-volatile semiconductor memory including a plurality of memory cells arranged in the form of a matrix, an erase means for simultaneously erasing the plurality of memory cells, a discriminating means for discriminating whether or not each one of the plurality of memory cells has been erased, an internal address generating means for supplying the discriminating means with an internal address for accessing each of the plurality of memory cells, a control means for controlling the erase means and the discriminating means in such a manner that, after a pre-erase writing is performed, the simultaneous erasing of the erasing means and the discrimination of the discriminating means are alternately performed, and a count means for counting the number of memory cells which are discriminated to be unerased by the discriminating means, the count means outputting to the control means an erase failure signal when the counted number becomes higher than a predetermined count limit number, the control means responding to the erase failure signal for stopping an operation of the discriminating means and for causing the erasing means to restart the simultaneous erasing.

More specifically, the discriminating means discriminates, one memory cell by one memory cell, whether or nor a memory cell is properly erased, and generates an erase discrimination signal each time it is discriminated that the memory cell discriminated is not properly erased. The count means counts up the erase discrimination signal. When the count number of the count means becomes higher than the predetermined count limit number, the count means outputs the erase failure signal indicating that the memory cell array has not yet been properly erased as a whole. Therefore, the control means stops an operation of the discriminating means and causes the erasing means to restart the simultaneous erasing. On the other hand, if the count number of the count means does not become higher than the predetermined count limit number when all of the memory cells have been discriminated, even if unerased memory cells of the number smaller than the predetermined count limit number are detected by the discriminating means, the erasing operation is completed. Thus, most of memory cells included in the memory are properly erased with no over-erasing. On the other hand, it is possible to accurately recognize truly defective positions in a wafer testing process.

In a preferred embodiment, the count means receives a test mode signal, and when the test mode signal is inactive, the predetermined count limit number of the count means is set to zero, and when the test mode signal is active, the predetermined count limit number of the count means is set to a positive integer.

Alternatively, the count means receives a test mode signal, and when the test mode signal is inactive, the count means outputs to the control means as the erase failure signal, a signal generated by the discriminating means when the discriminating means detects an unerased memory cell, and when the test mode signal is active, the count means outputs the erase failure signal when the counted number becomes higher than the predetermined count limit number.

In one embodiment, the predetermined count limit number is adjustable, for example, from an external device. Or, the predetermined count limit number can be adjusted by selectively cutting a fuse of a setting circuit.

Furthermore, the predetermined count limit number is adjustable from an external device.

In addition, the discriminating means can discriminate whether or not a writing is properly performed, at the time of a writing.

Specifically, the non-volatile semiconductor memory further includes at least one redundant memory cell row or column, and the predetermined count limit number is not larger than the number of the at least one redundant memory cell row or column.

The above and other objects, features and advantages of the present invention will be apparent from the following description of preferred embodiments of the invention with reference to the accompanying drawings.

DESCRIPTION OF THE PREFERRED EMBODIMENTS

Figure 1:
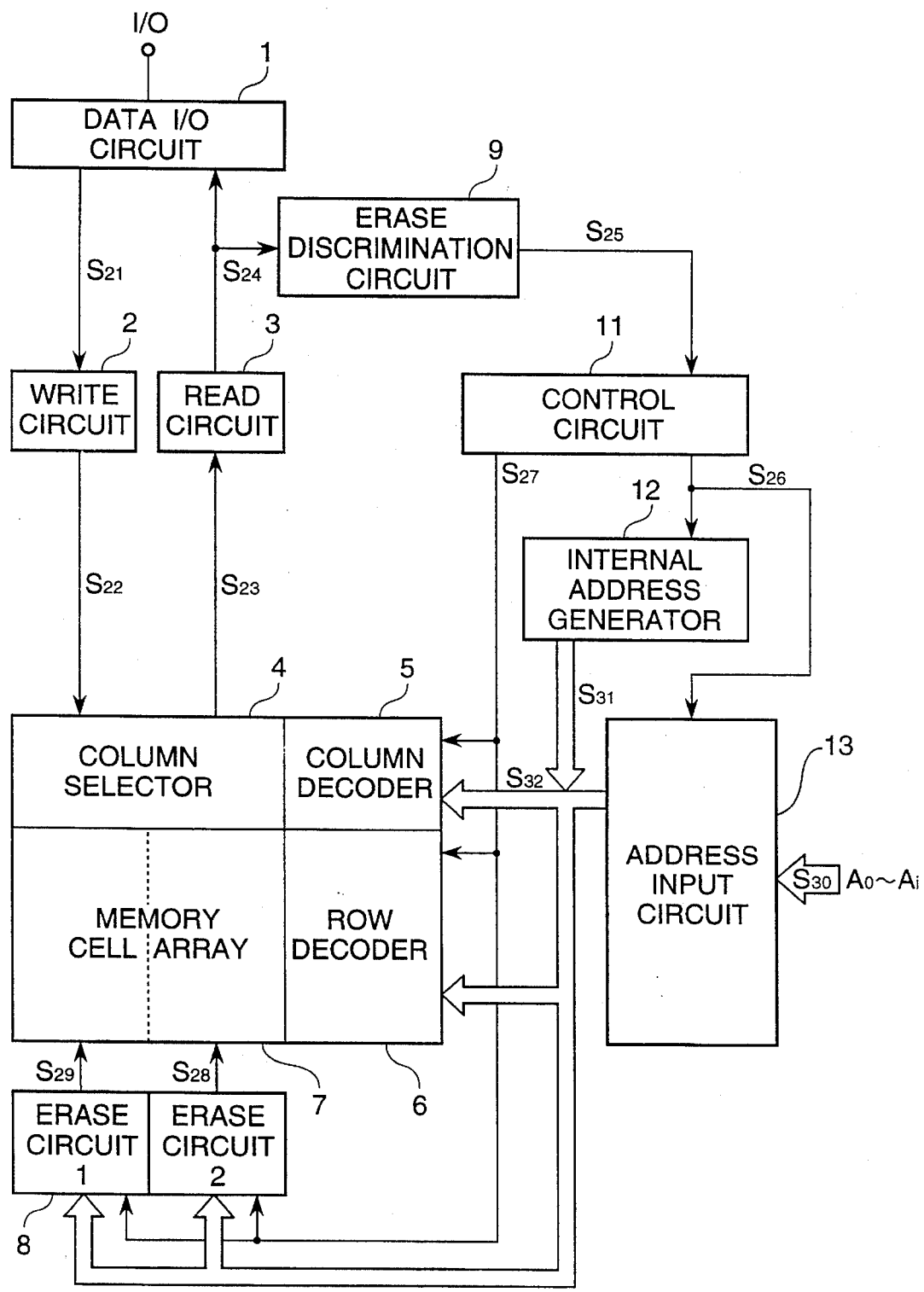
FIG. 1 is a block diagram illustrating one example of a conventional flash memory.
Figure 2:
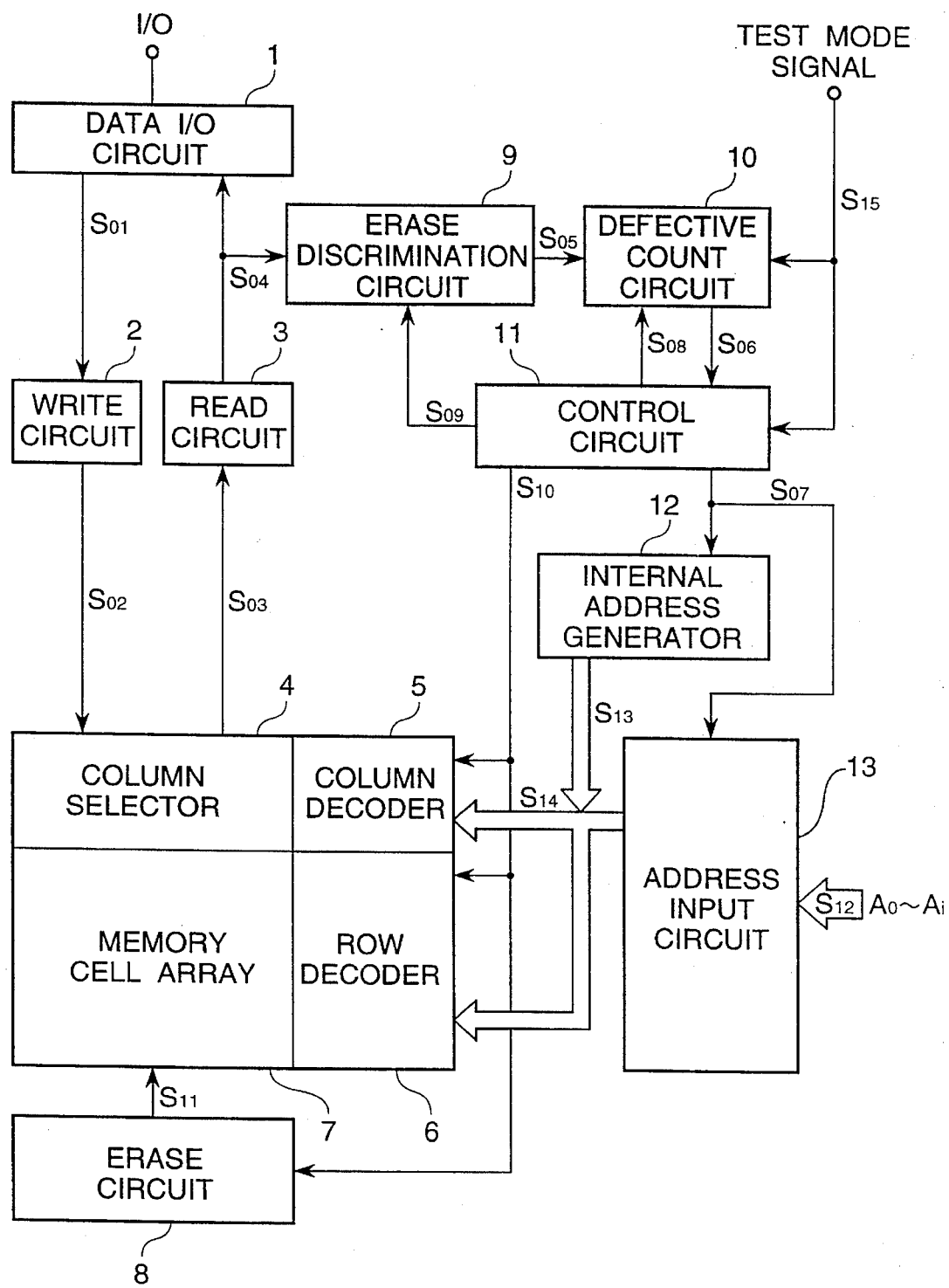
FIG. 2 is a block diagram of a first embodiment of the flash memory in accordance with the present invention.

Referring to FIG. 2, there is shown a block diagram of a first embodiment of the flash memory in accordance with the present invention. In FIG. 2, elements similar to those shown in FIG. 1 are given the same Reference Numerals.

The shown flash memory includes a data input/output circuit 1 coupled to a data input/output terminal I/O, a write circuit 2, a read circuit 3, a column selector 4, a column decoder 5, a row decoder 6, a memory cell array 7, an erase circuit 8, an erase discrimination circuit 9, a defective count circuit (unerased cell count circuit) 10, a control circuit 11, an internal address generator 12, and an address input circuit 13 coupled to address signal input terminals A0 to Ai, which are coupled as shown. In addition, Reference Numerals S01 and S15 designate various internal signals.

First, a data reading operation will be described with reference to FIG. 2. A group of address signals S12 are supplied through the address signal input terminals A0 to Ai to the address input circuit 13, which outputs a group of internal address signals S14. In response to the internal address signals S14, the column decoder 5 and the column selector 4 select one column line, and the row decoder 6 selects one row line. As a result, a memory cell positioned on an intersection between the selected column line and the selected row line is selected in the memory cell array 7, and data is read out from the selected memory cell through the column selector 4 as an internal read-out signal S03 to the read circuit 3, where the internal read-out signal S03 is amplified and outputted as an amplified read-out signal S04 to the data input/output circuit 1. This data input/output circuit 1 outputs the received read-out signal S04 as a data signal through the input/output terminal I/O.

On the other hand, when data is written, one memory cell is selected by the column decoder 5, the column selector 4, and the row decoder 6, similarly to the reading operation. Data to be written is supplied from the input/output terminal I/O through the data input/output circuit 1 to the write circuit 2 as an internal data signal S01. The write circuit 2 write a write data signal S02 to the memory cell selected as mentioned above.

Next, an erasing operation will be described.

The erasing operation is constituted of three sequences, namely, (1) pre-erase writing, (2) erase and (3) erase verify.

Here, in order to clarify and simplify the gist of the present invention, the explanation starts from the time where the (1) pre-erase writing has been completed, namely a situation in which data "0" has been written into all the memory cells. In addition, an ordinary mode erasing operation and a test mode erasing operation which is the feature of the present invention, will be described separately.

Figure 4:
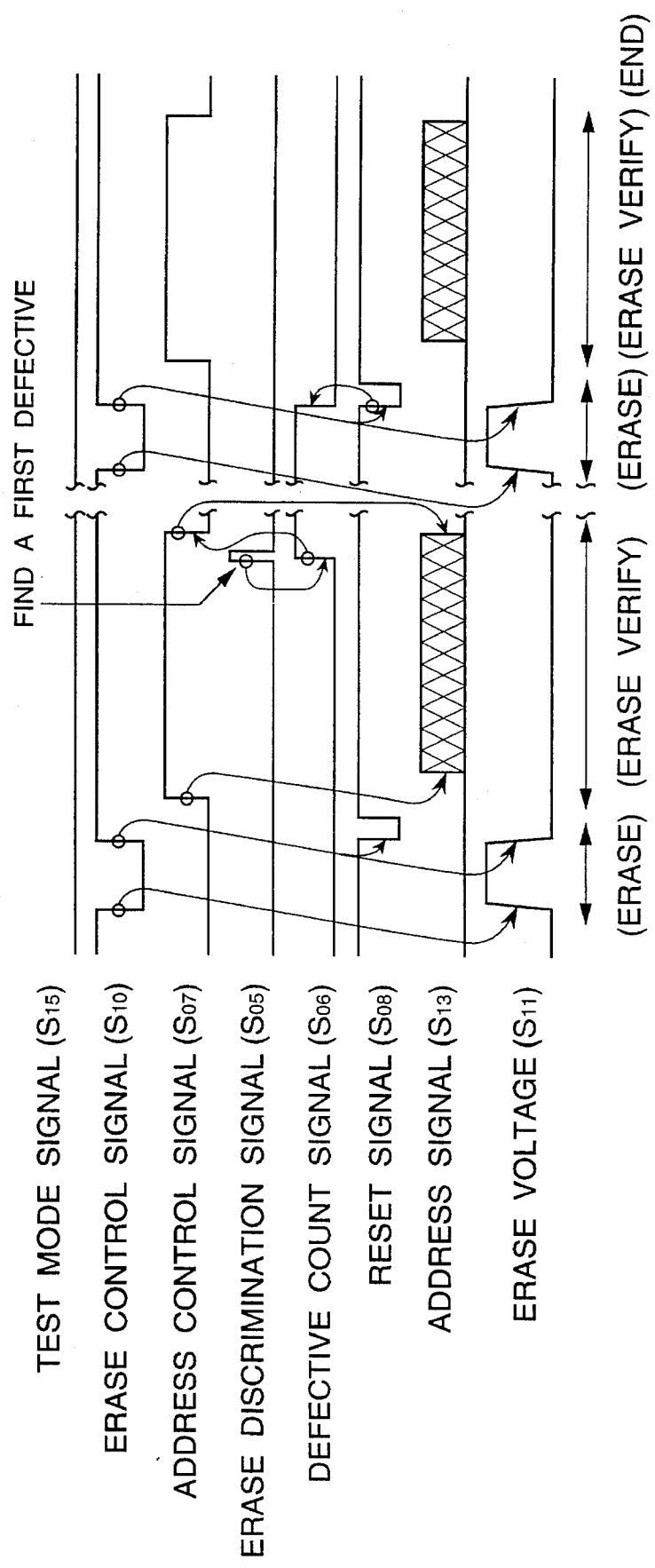
FIG. 4 is a timing chart illustrating an ordinary mode of the first embodiment of the flash memory in accordance with the present invention.

The ordinary mode erasing operation will be described with reference to FIG. 4. In this ordinary mode erasing operation, a test mode signal S15 applied to the defective count circuit 10 and the count circuit 11 is put in a disabled condition (for example a logical low level). When the test mode signal S15 is in the disabled condition, the defective count circuit 10 does not operate as a counter. In addition, the defective count circuit 10 maintains a reset signal S08 in a disabled condition (for example a logical high level).

The (2) erase is executed by a fact that the control circuit 11 outputs an (low active) erase enable signal S10 for a predetermined constant period of time. At this time, both the column decoder 5 and the row decoder 5 are put in a disabled condition of putting all the column lines and the row lines into a non-selected condition. On the other hand, the erase circuit 8 is put in an enabled condition of outputting a high voltage erase signal S11 so that a high voltage is supplied to sources of all the memory cells. Thus, the memory cell erasing is performed.

The (3) erase verify is executed by a fact that the control signal 11 outputs a control signal S09 and a control signal S07 to the erase discrimination circuit 9 and the internal address generator 12 and the address input circuit 13, so that the erase discrimination circuit 9 and the internal address generator 12 are put in an enabled condition, and the address input circuit 13 is put in a disabled condition. A group of internal address signals S13 generated in the internal address generator 12 are supplied to the column decoder 5 and the row decoder 6. With this, the memory cells in the memory cell array 7 are selected in order one by one, so that the selected memory cell is read out by the read circuit 3.

The erase discrimination circuit 9 receiving the output signal S04 from the read circuit 3, discriminates success or failure of the erase of the selected memory cell on the basis of the read-out signal S04. When it is discriminated that the memory cell under discrimination has not been erased, the erase discrimination circuit 9 outputs to the defective count circuit 10 an active erase discrimination signal S05 indicating that the memory cell under discrimination has not yet satisfactorily been erased. However, since the defective count circuit 10 does not operate as the counter, the active erase discrimination signal S05 is transferred to the control circuit 11 as an erase failure signal or defective count signal S06.

As a result, the control circuit 11 recognizes that the erase has not yet been erased, and stops the outputting of the signals S09 and S07 and simultaneously outputs the signal S10 so as to terminate the (3) erase verify and to restart the (2) erase. Therefore, the erase and the erase verify are performed, again.

Thus, the (2) erase and the (3) erase verify are repeated until it is discriminated that all the memory cells in the memory cell array 7 have been erased.

Figure 5:
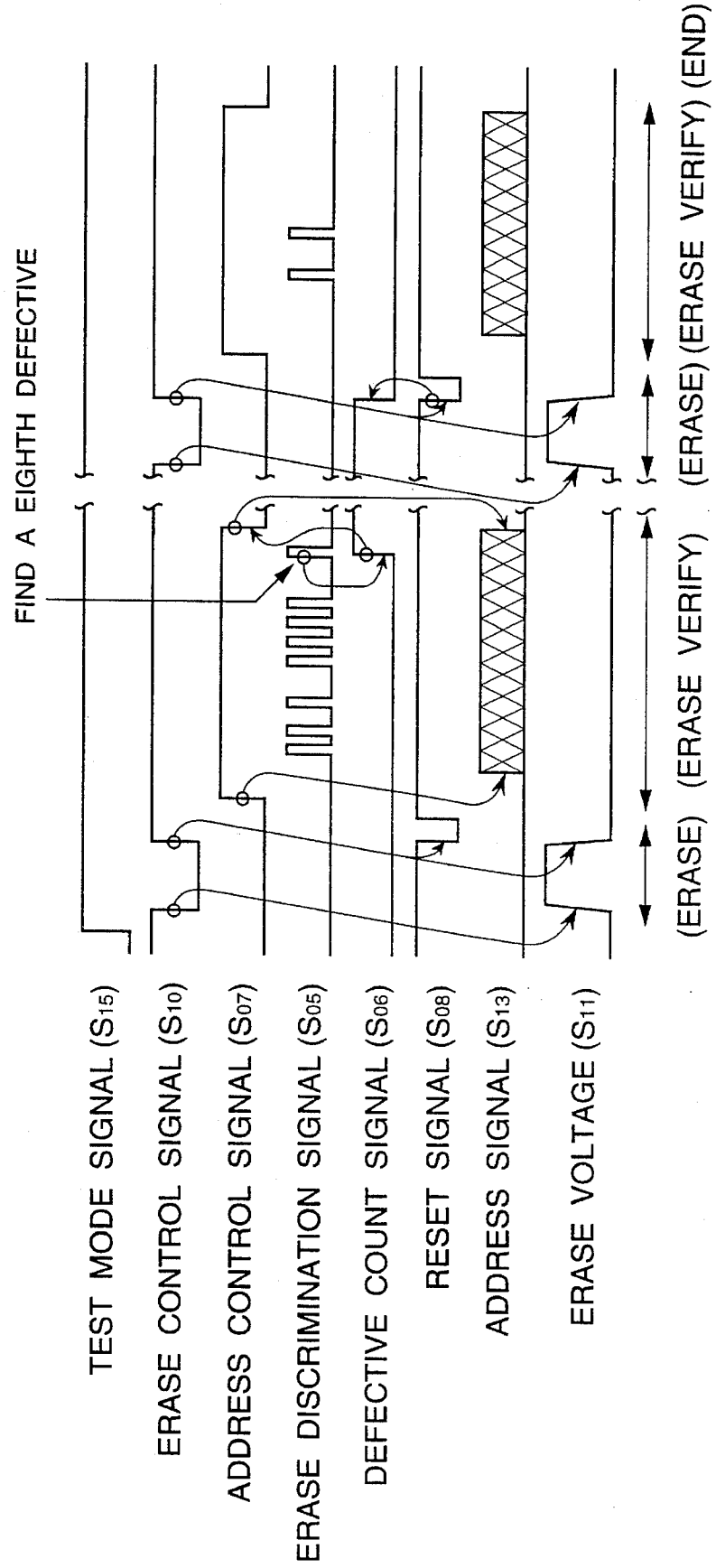
FIG. 5 is a timing chart illustrating a test mode of the first embodiment of the flash memory in accordance with the present invention.

Next, the test mode erasing operation is will be described with reference to FIG. 5. In this test mode erasing operation, a test mode signal S15 is put in an enabled condition (for example a logical high level), so that the defective count circuit 10 operates as a counter. For convenience of the succeeding explanation, a count limit value of the counter is set to "7" so that when the count value becomes "8", the a defective count signal (erase failure signal) S06 is outputted from the defective count 10 to the control circuit 11.

The (2) erase is executed by a fact that the control circuit 11 outputs the erase enable signal S10 for the predetermined constant period of time. In the succeeding, an operation similar to the operation of the (2) erase in the ordinary mode erasing operation is performed. At the completion of the (2) erase, the control circuit 11 outputs a reset signal S08 in the form of a one-shot pulse to the defective count circuit 10, so that the count value of the defective output circuit 10 is reset.

Similarly to the (3) erase verify of the ordinary mode erasing operation, the (3) erase verify is executed by a fact that the control signal 11 outputs the control signal S09 and the control signal S07 to the erase discrimination circuit 9 and the internal address generator 12 and the address input circuit 13, so that the erase discrimination circuit 9 and the internal address generator 12 are put in an enabled condition, and the address input circuit 13 is put in a disabled condition. Thereafter, the erase discrimination circuit 9 discriminates success or failure of the erase of the selected memory cell on the basis of the read-out signal S04. When it is discriminated that the memory cell under discrimination has not been erased, the erase discrimination circuit 9 outputs to the defective count circuit 10 an active erase discrimination signal S05 indicating that the memory cell under discrimination has not been erased. At this time, since the defective count circuit 10 operates as the counter, the count value of the defective count circuit 10 is counted up. If the count value of the defective count circuit 10 is smaller than "8", the defective count signal (erase failure signal) S06 is not outputted. Therefore, the control circuit 11 continues to output the signals S09 and S07.

In other words, the erase verify is continued (until the internal address generator 12 overflows). If the count value of the defective count circuit 10 becomes "8", the defective count circuit 10 outputs the defective count signal (erase failure signal) S06. As a result, the control circuit 11 recognizes that the erase has not yet been completed as a whole, and stops the outputting of the signals S09 and S07 so as to terminate the (3) erase verify, and simultaneously outputs the signal S10 so as to restart the (2) erase. Therefore, the erase and the erase verify are performed again.

Thus, the (2) erase and the (3) erase verify are repeated until the number of unerased memory cells included in the memory cell array 7 becomes 7 bits or less.

Figure 3A:
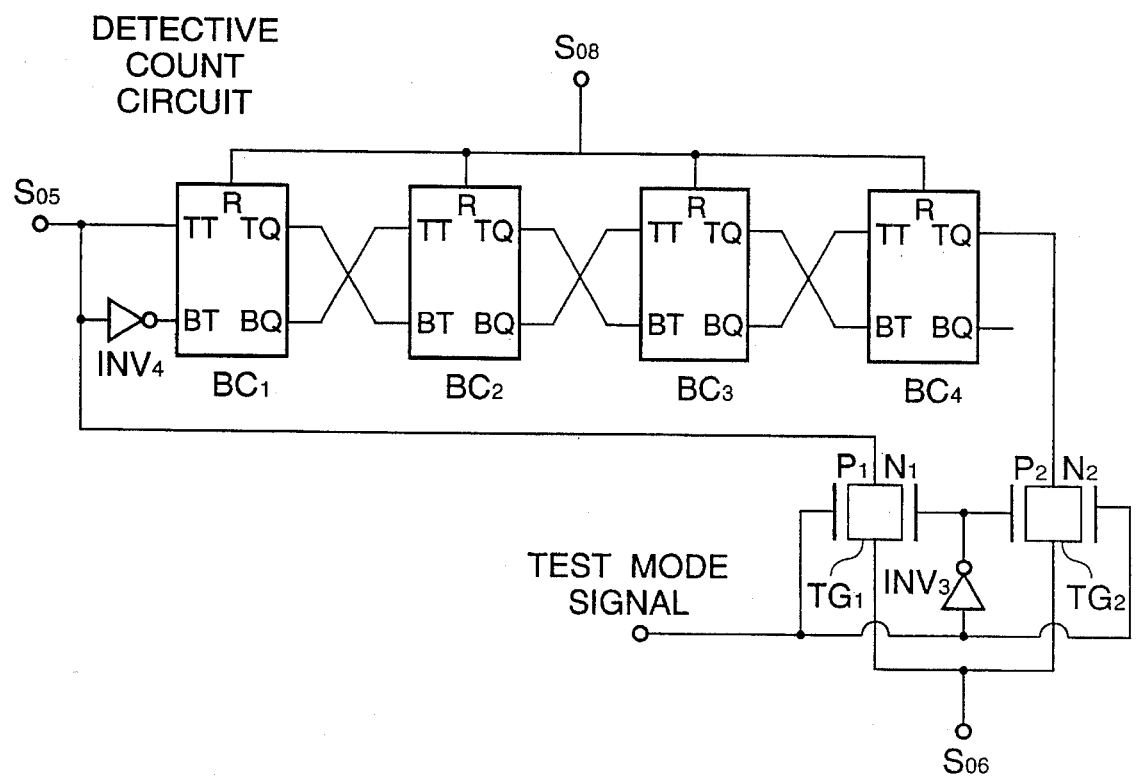
FIG. 3A is a circuit diagram of one example of the defective count circuit included in the embodiment shown in FIG. 2.

Referring to FIG. 3A, there is shown a circuit diagram of the defective count circuit 10. The defective count circuit 10 includes four cascaded binary counters BC1 to BC4 having a reset terminal connected in common to receive the reset signal S08. The erase discrimination signal S05 is connected to a non-inverted logic signal input TT of the binary counters BC1 and through an inverter INV4 to an inverted logic signal input BT of the binary counters BC1.

The four cascaded binary counters BC1 to BC4 are connected in such a manner that a non-inverted logic signal output TQ and an inverted logic signal output BQ of a preceding binary counter are connected to an inverted logic signal input BT and a non-inverted logic signal input TT of a just succeeding binary counter, respectively. In addition, the erase discrimination signal S05 is supplied through a transfer gate TG1 consisting of parallel-connected P-channel transistor P1 and N-channel transistor N1, to a terminal for the defective count signal S06. The non-inverted logic signal output TQ of the final binary counter BC4 is connected to a transfer gate TG2 consisting of parallel-connected P-channel transistor P2 and N-channel transistor N2, to the terminal for the defective count signal S06. The P-channel transistor P1 and the N-channel transistor N2 have their gate connected to receive the test mode signal S15, and the N-channel transistor N1 and the P-channel transistor P2 have their gate connected to receive through an inverter INV3 the test mode signal S15.

Thus, these transfer gates TG1 and TG2 are alternatively turned on by the test mode signal S15. Namely, when the test mode signal S15 is at a high level, the transfer gate TG1 is rendered non-conductive and the transfer gate TG2 is rendered conductive so that the non-inverted logic signal output TQ of the final binary counter BC4 is outputted through the transfer gate TG2 as the defective count signal S06. On the other hand, when the test mode signal S15 is at a low level, the transfer gate TG1 is rendered conductive and the transfer gate TG2 is rendered non-conductive so that erase discrimination signal S05 is outputted without modification through the transfer gate TG1 as the defective count signal S06.

Figure 3B:
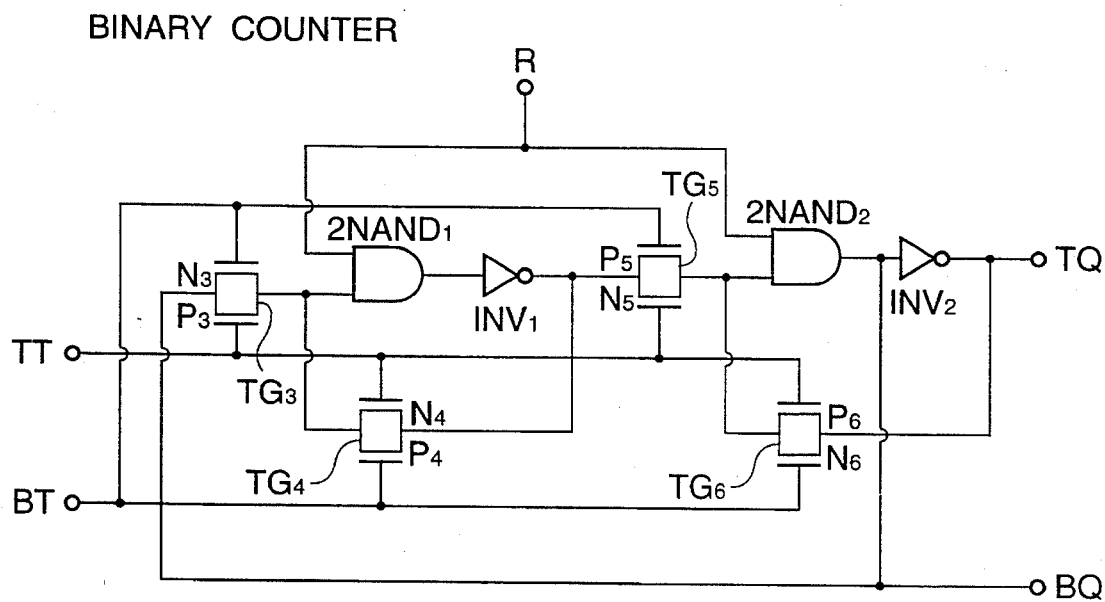
FIG. 3B shows a circuit diagram of one example of the binary counter used in the defective count circuit shown in FIG. 3A.

FIG. 3B shows a circuit diagram of one example of the binary counter used in the defective count circuit 10 shown in FIG. 3A.

The shown binary counter includes two two-input NAND circuits 2NAND1 and 2NAND2, two inverters INV1 and INV2 and four transfer gates TG3, TG4, TG5 and TG6, which are connected as shown. Each of the transfer gates TG3, TG4, TG5 and TG6, is constituted of parallel-connected P-channel transistor and N-channel transistor P3 and N3, P4 and N4, P5 and N5, or P6 and N6, which are connected by the non-inverted logic signal input TT and the inverted logic signal input BT of the binary counter, respectively. Since the construction and the operation of the shown binary counter is known to persons skilled in the art, more derailed description thereof will be omitted.

Figure 6A:
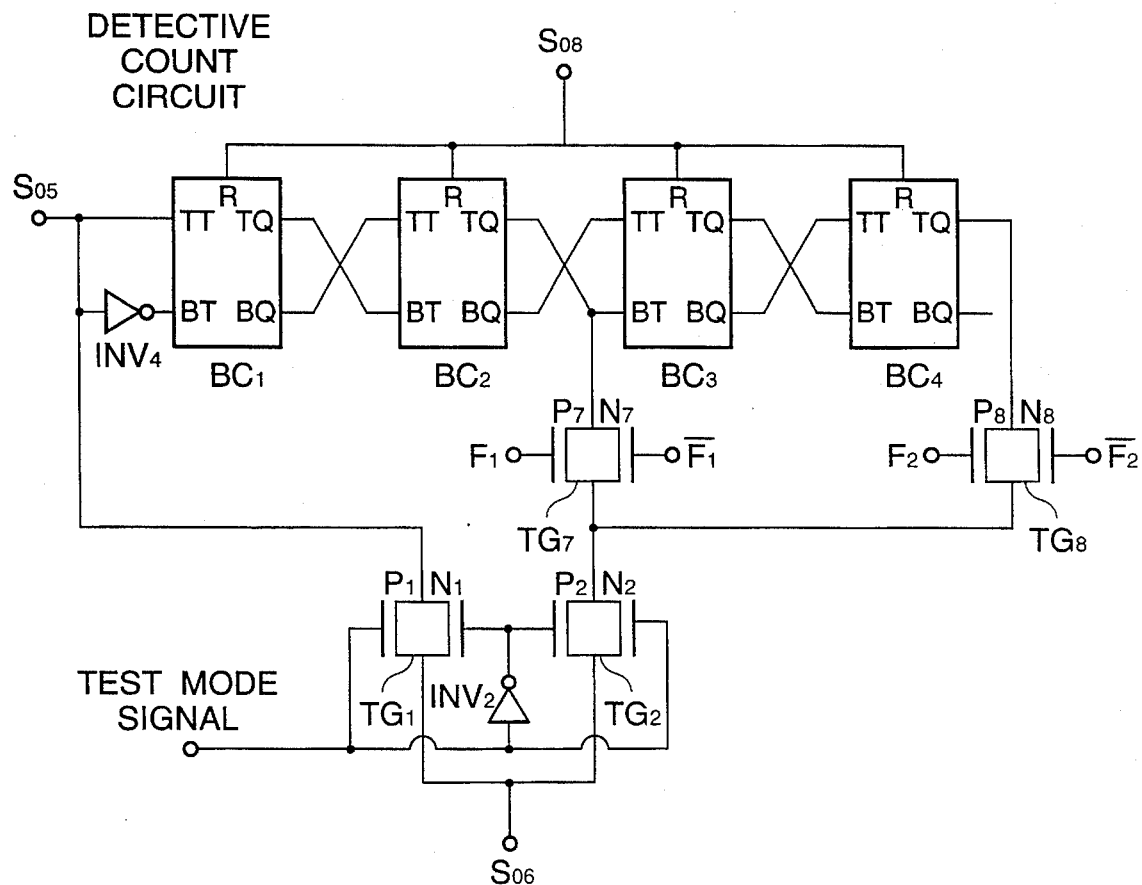
FIG. 6A is a circuit diagram of another example of the defective count circuit included in the embodiment shown in FIG. 5.

Referring to FIG. 6A, there is shown a circuit diagram of a defective count circuit 10 incorporated in a second embodiment of the flash memory in accordance with the present invention. This second embodiment of the flash memory has the same construction as that of the first embodiment of the flash memory, excepting for the defective count circuit 10, and operates similarly to the first embodiment. But, the defective count circuit 10 incorporated in the second embodiment has a function elevated in comparison with that of the first embodiment.

In FIG. 6A, elements similar to those shown in FIG. 3A are given the same Reference Numerals. As seen from comparison between FIGS. 3A and 6A, the second embodiment includes a pair of additional transfer gates TG7 and TG8, which are controlled by two pair of complementary control signals F1 and $\overline{F1}$ and F2 and $\overline{F2}$ for selectively setting the count limit number of the defective count circuit 10.

The transfer gate TG7 constituted of parallel-connected P-channel transistor P7 and and N-channel transistor N7, is connected between the non-inverted logic signal output TQ of the second binary counter BC2 and the transfer gate TG2. A gate of the P-channel transistor P7 is connected to receive the control signal Fi, and a gate of the N-channel transistor N7 is connected to receive the control signal $\overline{F1}$ complementary to the control signal F1. In addition, the transfer gate TG8 constituted of parallel-connected P-channel transistor P8 and and N-channel transistor N8, is connected between the non-inverted logic signal output TQ of the final binary counter BC4 and the transfer gate TG2. A gate of the P-channel transistor P8 is connected to receive the control signal F2, and a gate of the N-channel transistor N7 is connected to receive the control signal $\overline{F2}$ complementary to the control signal F2.

Figure 6B:
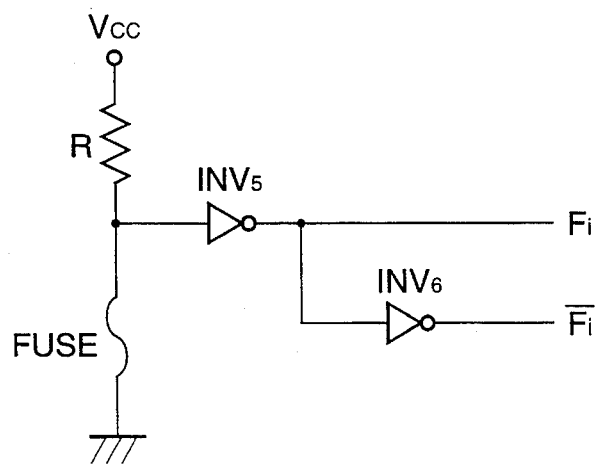
FIG. 6B is a circuit diagram of a circuit for generating the control signal setting the count limit number in the defective count circuit shown in FIG. 6A.

Referring to FIG. 6B, there is shown a circuit for generating the control signals F1 and $\overline{F1}$ and F2 and $\overline{F2}$. The shown circuit includes a resistor R and a fuse FUSE connected in series between a high power supply voltage Vcc and ground. A connection node between the resistor R and the fuse FUSE is connected to an input of an inverter INV5, which has an output for generating a non-inverted control signal Fi (where "i" is 1 or 2). The output of the inverter INV5 is connected to an input of an inverter INV6, which has an output for generating an inverted control signal $\overline{Fi}$ (where "i" is 1 or 2). Thus, by either cutting the fuse or maintain the fuse conductive, it is possible to set a count limit value of the defective count circuit 10 at a desired value. In the shown second embodiment, therefore, since the pair of additional transfer gates TG7 and TG8 are alternatively turned on, the control signal F2 can be formed of the control signal $\overline{F1}$, and the control signal $\overline{F2}$ can be formed of the control signal F1.

As seen from the above, the operation of the second embodiment is completely the same as that of the first embodiment, excepting that the count limit value of the detective count circuit 10 is selective or can be set at a desired value.

In a wafer test step of the flash memory manufacturing process, if the test mode of the present invention is used, when a device under test includes a small number of memory cells having a low erase speed, the erasing operation can be completed in such a condition that most of memory cells included in the device have been erased just to have a suitable threshold with no over-erasing. To the contrary, the small number of memory cells having the low erase speed have a not-suitable or high threshold.

In this condition, the device mixedly includes the greater part of memory cells having a low threshold (namely, a desired threshold) and a small number of memory cells having a high threshold.

After the test mode erasing operation is completed, if a test system is used to check whether or not the threshold of the memory cells is low (for example, by performing a reading test by applying a low voltage to memory cell gates), the test system can recognize that the device includes a small number of defective memory cells (namely, having a high threshold) and therefore, can obtain information concerning a location where a redundancy repairing should be made. Therefore, by setting the count limit value of the defective count circuit 10 of the shown embodiments equal to a value which is not larger than the number of redundant spare memory cell rows or columns, it is possible to effectively utilize the present invention.

As seen from the above, the present invention is characterized in that, in the erasing operation, the number of memory cells having a low erase speed is counted, and if the counted number is smaller than a predetermined number, the erasing operation is completed. With this feature, a suitable erasing can be performed for most of memory cells included in a memory cell array, excluding a small number of memory cells having a slow erase speed. In addition, it is possible to identify truly defective memory cells having a slow erase speed, it is possible to accurately recognize the true defective positions in the wafer testing processing in which the redundancy repairing is performed. Namely, the yield in the wafer testing processing can be elevated.

Furthermore, by causing the device to internally include the above mentioned function of the present invention, it is possible to greatly shorten the test time of the testing process.

The invention has thus been shown and described with reference to the specific embodiments. However, it should be noted that the present invention is in no way limited to the details of the illustrated structures but changes and modifications may be made within the scope of the appended claims.

I claim:

1. A non-volatile semiconductor memory including a plurality of memory cells arranged in the form of a matrix, an erase means for simultaneously erasing said plurality of memory cells, a discriminating means for discriminating whether or not each one of said plurality of memory cells has been erased, an internal address generating means for supplying said discriminating means with an internal address for accessing each of said plurality of memory cells, a control means for controlling said erase means and said discriminating means in such a manner that, after a pre-erase writing is performed, said simultaneous erasing of said erasing means and said discrimination of said discriminating means are alternately performed, and a count means for counting the number of memory cells which are discriminated to be unerased by said discriminating means, said count means outputting to said control means an erase failure signal when the counted number becomes higher than a predetermined count limit number, said control means responding to said erase failure signal for stopping an operation of said discriminating means and for causing said erasing means to restart said simultaneous erasing.

2. A non-volatile semiconductor memory claimed in claim 1 wherein said count means receives a test mode signal, and when said test mode signal is inactive, said predetermined count limit number of said count means is set to zero, and when said test mode signal is active, said predetermined count limit number of said count means is set to a positive integer.

3. A non-volatile semiconductor memory claimed in claim 1 wherein said count means receives a test mode signal, and when said test mode signal is inactive, said count means outputs to said control means as said erase failure signal, an unerased signal generated by said discriminating means when said discriminating means detects an unerased memory cell, and when said test mode signal is active, said count means outputs said erase failure signal when the counted number becomes higher than said predetermined count limit number.

4. A non-volatile semiconductor memory claimed in claim 1 wherein said predetermined count limit number is adjustable.

5. A non-volatile semiconductor memory claimed in claim 1 wherein said predetermined count limit number can be adjusted by selectively cutting a fuse of a setting circuit.

6. A non-volatile semiconductor memory claimed in claim 1 wherein said predetermined count limit number is adjustable from an external device.

7. A non-volatile semiconductor memory claimed in claim 1 wherein said discriminating means can discriminate whether or not writing is properly performed, at the time of a writing.

8. A non-volatile semiconductor memory claimed in claim 1 further including at least one redundant memory cell row or column, and wherein said predetermined count limit number is not larger than the number of said at least one redundant memory cell row or column.

* * * * *